(12) United States Patent
Jeong

(10) Patent No.: US 11,335,421 B2
(45) Date of Patent: May 17, 2022

(54) MEMORY DEVICE AND METHOD OF OPERATING THE SAME

(71) Applicant: SK hynix Inc., Gyeonggi-do (KR)

(72) Inventor: Min Kyu Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 38 days.

(21) Appl. No.: 16/995,151

(22) Filed: Aug. 17, 2020

(65) Prior Publication Data

US 2021/0280262 A1    Sep. 9, 2021

(30) Foreign Application Priority Data

Mar. 4, 2020  (KR) ........................ 10-2020-0027425

(51) Int. Cl.
| | | |
|---|---|---|
| *G11C 16/06* | (2006.01) | |
| *G11C 16/34* | (2006.01) | |
| *G11C 16/04* | (2006.01) | |
| *G11C 16/26* | (2006.01) | |
| *G11C 16/10* | (2006.01) | |
| *G11C 11/56* | (2006.01) | |

(52) U.S. Cl.
CPC ...... *G11C 16/3459* (2013.01); *G11C 16/0483* (2013.01); *G11C 16/10* (2013.01); *G11C 16/26* (2013.01); *G11C 11/5671* (2013.01)

(58) Field of Classification Search
CPC . G11C 16/10; G11C 16/26; G11C 2211/5621; G11C 2211/5648; G11C 11/5628; G11C 11/5642; G11C 16/3413; G11C 2216/20; G11C 11/5671
See application file for complete search history.

(56) References Cited

U.S. PATENT DOCUMENTS

| | | | | |
|---|---|---|---|---|
| 2009/0067247 | A1* | 3/2009 | Park .................. | G11C 16/0483 |
| | | | | 365/185.17 |
| 2018/0197610 | A1* | 7/2018 | Lee ..................... | G11C 16/24 |
| 2018/0247695 | A1* | 8/2018 | Kasai .................. | G11C 16/10 |

FOREIGN PATENT DOCUMENTS

| | | |
|---|---|---|
| KR | 10-2018-0081956 | 7/2018 |
| KR | 10-2019-0019364 | 2/2019 |

OTHER PUBLICATIONS

Tsai et al., Polycrystalline-Silicon Channel Trap Induced Transient Read Instability in a 3D NAND Flash Cell String, 2016 IEEE International Electron Devices Meeting (IEDM), Dec. 2016, pp. 11.3.1-11.3.4, IEEE, USA.

* cited by examiner

Primary Examiner — Uyen Smet
(74) Attorney, Agent, or Firm — IP & T Group LLP

(57) ABSTRACT

Provided herein is a memory device and a method of operating the same. The memory device may include a plurality of memory cells, a peripheral circuit, and a control logic. The peripheral circuit may be configured to perform a plurality of program loops, each including a program pulse apply operation and a program verify operation, on selected memory cells of the plurality of memory cells. The control logic may be configured to control, in response to a suspend command, the peripheral circuit to suspend an n-th program loop of the plurality of program loops, where n is a natural number of 1 or more, and configured to control, in response to a resume command, the peripheral circuit to resume the suspended n-th program loop after performing a recovery pulse apply operation compensating for charges detrapped from a channel area of the selected memory cells.

19 Claims, 12 Drawing Sheets

US 11,335,421 B2

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0027425, filed on Mar. 4, 2020, which is incorporated herein by reference in its entirety.

BACKGROUND

1. Field of Invention

Various embodiments of the present disclosure generally relate to an electronic device, and more particularly, to a memory device and a method of operating the memory device.

2. Description of Related Art

A storage device is a device which stores data under the control of a host device, such as a computer or a smartphone. The storage device may include a memory device in which data is stored and a memory controller which controls the memory device. Such memory devices are classified into a volatile memory device and a nonvolatile memory device.

The volatile memory device is a memory device in which data is stored only when power is supplied and in which stored data is lost when the supply of power is interrupted. Examples of the volatile memory device include a Static Random Access Memory (SRAM) and a Dynamic Random Access Memory (DRAM).

The nonvolatile memory device is a memory device in which stored data is retained even when the supply of power is interrupted. Examples of the nonvolatile memory device include a Read Only Memory (ROM), a Programmable ROM (PROM), an Electrically Programmable ROM (EPROM), an Electrically Erasable and Programmable ROM (EEPROM), and a flash memory.

SUMMARY

Various embodiments of the present disclosure are directed to a memory device having improved program performance and a method of operating the memory device.

An embodiment of the present disclosure may provide for a memory device. The memory device may include a plurality of memory cells, a peripheral circuit, and a control logic. The peripheral circuit may be configured to perform a plurality of program loops, each including a program pulse apply operation and a program verify operation, on selected memory cells among the plurality of memory cells. The control logic may be configured to control, in response to a suspend command, the peripheral circuit to suspend an n-th program loop among the plurality of program loops, where n is a natural number of 1 or more, and configured to control, in response to a resume command, the peripheral circuit to resume the suspended n-th program loop after performing a recovery pulse apply operation compensating for charges detrapped from a channel area of the selected memory cells.

An embodiment of the present disclosure may provide for a method of operating a memory device including a plurality of memory cells. The method may include suspending an n-th program loop, among a plurality of program loops on selected memory cells among the plurality of memory cells, in response to a suspend command received during the n-th program loop, where n is a natural number of 1 or more; and resuming the suspended n-th program loop after a recovery pulse apply operation has been performed in response to a resume command. Wherein each of the plurality of program loops includes a program pulse apply operation and a program verify operation. Wherein the recovery pulse apply operation is an operation of compensating for charges detrapped from a channel area of the selected memory cells.

An embodiment of the present disclosure may provide for an operating method of a memory device. The operating method comprises: suspending, in response to a suspend command for a program operation on a storage unit, a start of a state verification operation on one among program states, the state verification operation being a part of the program operation; applying, in response to a resume command for the program operation, one or more recovery pulses to the storage unit; and resuming, upon completion of the applying, the program operation from the suspended start.

DETAILED DESCRIPTION

Specific structural or functional descriptions of various embodiments of the present disclosure introduced in this disclosure are mere examples for describing the various embodiments. Various embodiments of the present disclosure may be practiced in various forms, and should not be construed as being limited to the embodiments described in the specification or application.

Figure 1:
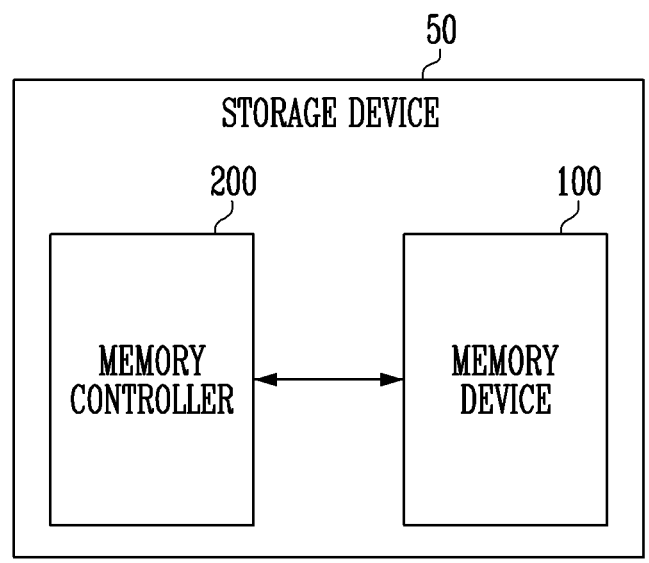
FIG. 1 is a diagram illustrating a storage device according to an embodiment of the present disclosure.

FIG. 1 is a diagram illustrating a storage device according to an embodiment of the present disclosure.

Referring to FIG. 1, a storage device 50 may include a memory device 100 and a memory controller 200 which controls the operation of the memory device. The storage device 50 may be a device which stores data under the control of a host, such as a mobile phone, a smartphone, an MP3 player, a laptop computer, a desktop computer, a game console, a television (TV), a tablet PC, or an in-vehicle infotainment system.

The storage device 50 may be manufactured as any one of various types of storage devices depending on a host interface that is a communication scheme with the host. The storage device 50 may be implemented as any one of various types of storage devices, for example, a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data.

Each of the memory cells may be implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits. In an embodiment, each of the memory cells may be implemented as a cell capable of storing five or more data bits.

The memory cell array may include a plurality of memory blocks. Each memory block may include a plurality of memory cells. A single memory block may include a plurality of pages. In an embodiment, each page may be a unit by which data is stored in the memory device 100 or by which data stored in the memory device 100 is read.

A memory block may be a unit by which data is erased. In an embodiment, the memory device 100 may be configured of various alternative forms, such as but not limited to, a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, the memory device 100 is a NAND flash memory.

The memory device 100 may receive a command and an address from the memory controller 200, and may access the area of the memory cell array, selected by the address. That is, the memory device 100 may perform an operation indicated by the command on the area selected by the address. For example, some of the operations that the memory device 100 may perform include a write operation (i.e., program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

In an embodiment, the memory device 100 may perform a program operation including one or more program loops in response to a program command received from the memory controller 200. Each program loop may include a program pulse apply operation and a program verify operation.

The memory device 100 may suspend a program loop in execution in response to a suspend command received from the memory controller 200.

The memory device 100 may perform a read operation while the program loop is suspended.

In an embodiment, the memory device 100 may perform a read operation while the program loop is suspended in response to the suspend command. For example, when a read command is received during the execution of the program loop, the read command may function as the suspend command, and the memory device 100 may perform a read operation after suspending the program loop.

In an embodiment, the memory device 100 may perform a read operation while the program loop is suspended in response to a read command received from the memory controller 200 after a suspend command has been received. For example, when the suspend command is received during the execution of the program loop, the memory device 100 may suspend the program loop. Thereafter, the memory device 100 may perform a read operation in response to a separate read command received from the memory controller 200.

The memory device 100 may resume the suspended program loop in response to a resume command received from the memory controller 200. The memory device 100 may resume the program loop after performing a recovery pulse apply operation in response to the resume command. The recovery pulse apply operation may be an operation of compensating for charges detrapped from the channel area of the memory cells selected for the program operation while the program loop is suspended.

The recovery pulse apply operation may be an operation of applying at least one recovery pulse to a selected word line coupled to selected memory cells. The level of the recovery pulse may be variously set. In an embodiment, the level of the recovery pulse may be lower than that of a program pulse. The level of the recovery pulse may be equal to or higher than that of a pass voltage applied to an unselected word line. The level of the recovery pulse may increase as a count value of the suspended program loop increases. That is, the level of the recovery pulse may be proportional to the count value of the suspended program loop.

During the suspension of the program loop, the degradation of a threshold voltage distribution may occur while charges trapped in the channel area of the selected memory cells are discharged. For example, when the charges trapped in the channel area of the selected memory cells are discharged, the magnitude of a sensing current may increase during a verify operation. When the magnitude of the sensing current increases, the level of a verify voltage becomes higher than a reference level, and thus the selected memory cells may be programmed in a state in which the threshold voltage distribution of the selected memory cells are shifted to right with respect to a normal threshold voltage distribution. That is, the threshold voltage distribution of the selected memory cells may be degraded.

In accordance with an embodiment of the present disclosure, the memory device 100 may resume a program loop after performing a recovery pulse apply operation in response to a resume command, thus compensating for charges detrapped from the channel area of the selected memory cells and overcoming the degradation of a threshold voltage distribution.

The memory controller 200 controls the overall operation of the storage device 50.

When power is applied to the storage device 50, the memory controller 200 may run firmware (FW). When the memory device 100 is a flash memory device, the memory controller 200 may run firmware such as a Flash Translation Layer (FTL) for controlling communication between the host and the memory device 100.

In an embodiment, the memory controller 200 may receive data and a logical block address (LBA) from the host, and may translate the logical block address (LBA) into a physical block address (PBA) indicating the address of memory cells which are included in the memory device 100 and in which data is to be stored.

The memory controller 200 may control the memory device 100 so that a program operation, a read operation, or an erase operation is performed in response to a request received from the host. During a program operation, the memory controller 200 may provide a write command, a physical block address (PBA), and data to the memory device 100. During a read operation, the memory controller 200 may provide a read command and a physical block address (PBA) to the memory device 100. During an erase operation, the memory controller 200 may provide an erase command and a physical block address (PBA) to the memory device 100.

In an embodiment, the memory controller 200 may autonomously generate a command, an address, and data regardless of whether a request from the host is received, and may transmit them to the memory device 100. For example, the memory controller 200 may provide commands, addresses, and data to the memory device 100 to perform background operations, such as a program operation for wear leveling and a program operation for garbage collection.

In an embodiment, the memory controller 200 may control at least two memory devices 100. In this case, the memory controller 200 may control the memory devices 100 using an interleaving scheme to improve operating performance. The interleaving scheme may be an operating manner in which the operating periods of at least two memory devices 100 overlap each other.

The host may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
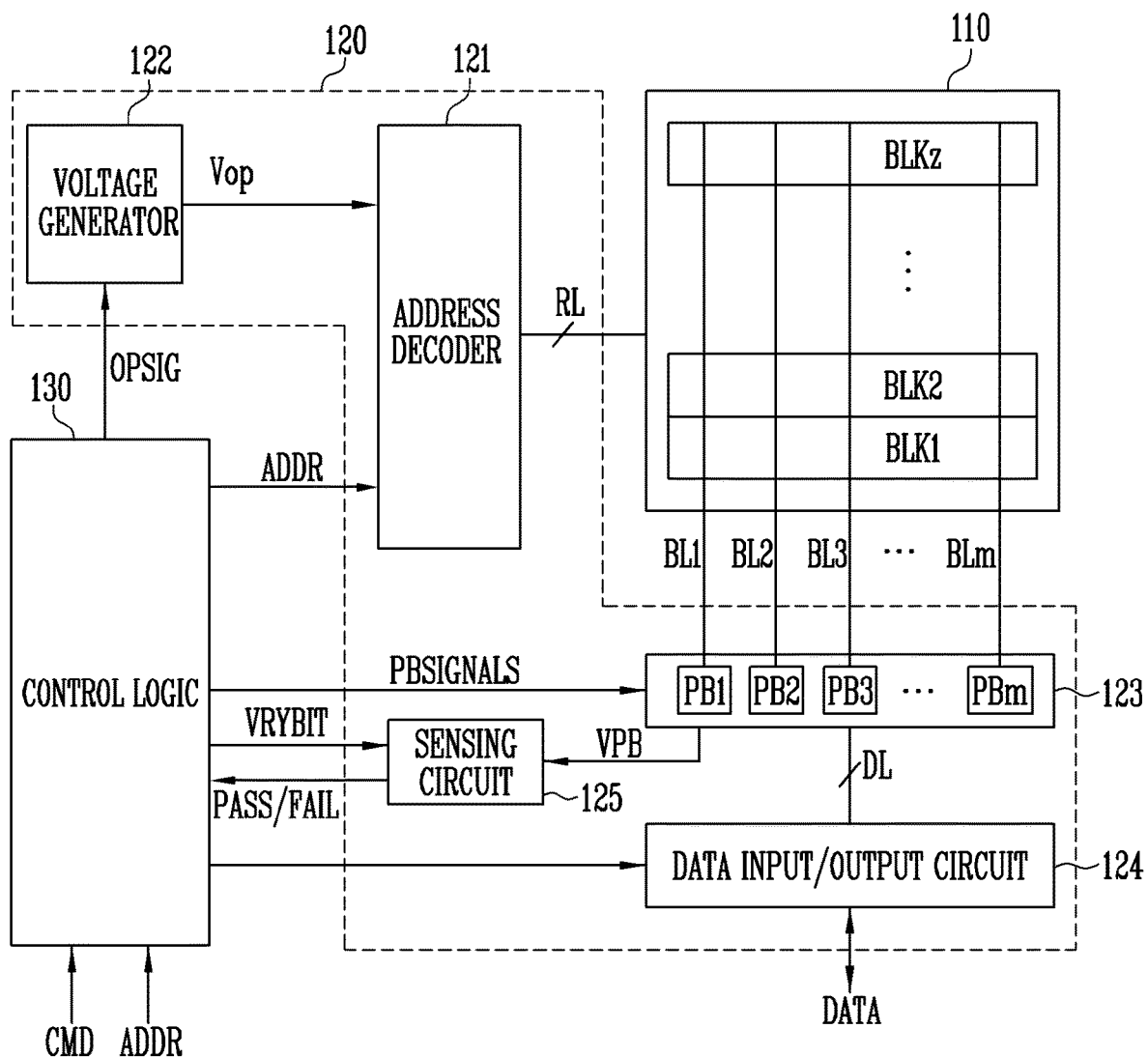
FIG. 2 is a diagram illustrating the structure of a memory device of FIG. 1.

FIG. 2 is a diagram illustrating the structure of the memory device of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single physical page. That is, the memory cell array 110 is composed of a plurality of physical pages. In accordance with an embodiment of the present disclosure, each of the plurality of memory blocks BLK1 to BLKz included in the memory cell array 110 may include a plurality of dummy cells. One or more dummy cells may be coupled in series between a drain select transistor and the memory cells and between a source select transistor and the memory cells.

The peripheral circuit 120 may include the address decoder 121, a voltage generator 122, the read and write circuit 123, a data input/output circuit 124, and a sensing circuit 125.

The peripheral circuit 120 may drive the memory cell array 110. For example, the peripheral circuit 120 may drive the memory cell array 110 so that a program operation, a read operation, and an erase operation are performed.

The address decoder 121 is coupled to the memory cell array 110 through row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may be operated under the control of the control logic 130. The address decoder 121 receives addresses ADDR from the control logic 130.

The address decoder 121 may decode a block address, among the received addresses ADDR. The address decoder 121 selects at least one of the memory blocks BLK1 to BLKz according to the decoded block address. The address decoder 121 may decode a row address among the received addresses ADDR. The address decoder 121 may select at least one of word lines of the selected memory block according to the decoded row address. The address decoder 121 may apply operating voltages Vop supplied from the voltage generator 122 to the selected word line.

During a program operation, the address decoder 121 may apply a program voltage to the selected word line and apply a pass voltage having a level lower than that of the program voltage to unselected word lines. During a program verify operation, the address decoder 121 may apply a verify voltage to a selected word line and apply a verify pass voltage having a level higher than that of the verify voltage to unselected word lines.

During a read operation, the address decoder 121 may apply a read voltage to a selected word line and apply a read pass voltage having a level higher than that of the read voltage to unselected word lines.

In accordance with an embodiment of the present disclosure, the erase operation of the memory device 100 may be performed on a memory block basis. During an erase operation, the addresses ADDR input to the memory device 100 include a block address. The address decoder 121 may decode the block address and select a single memory block in response to the decoded block address. During the erase operation, the address decoder 121 may apply a ground voltage to word lines coupled to the selected memory block.

In accordance with an embodiment of the present disclosure, the address decoder 121 may decode a column address among the received addresses ADDR. The decoded column address may be transferred to the read and write circuit 123. In an embodiment, the address decoder 121 may include components such as a row decoder, a column decoder, and an address buffer.

The voltage generator 122 may generate a plurality of operating voltages Vop using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate the plurality of operating voltages Vop using the external supply voltage or the internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage to generate a plurality of operating voltages Vop having various voltage levels, and may generate the plurality of operating voltages Vop by selectively enabling the plurality of pumping capacitors under the control of the control logic 130.

The generated operating voltages Vop may be supplied to the memory cell array 110 by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data DATA to be stored through the data input/output circuit 124 and data lines DL.

During a program operation, the first to m-th page buffers PB1 to PBm may transfer the data DATA to be stored, received through the data input/output circuit 124, to selected memory cells through the bit lines BL1 to BLm when a program pulse is applied to a selected word line. Memory cells in a selected page are programmed based on the received data DATA. Memory cells coupled to a bit line to which a program permission voltage (e.g., a ground voltage) is applied may have increased threshold voltages. The threshold voltages of memory cells coupled to a bit line to which a program inhibit voltage (e.g., a supply voltage) is applied may be maintained. During a program verify operation, the first to m-th page buffers PB1 to PBm read the data DATA stored in the selected memory cells through the bit lines BL1 to BLm.

During a read operation, the read and write circuit 123 may read data DATA from the memory cells in the selected page through the bit lines BL, and may store the read data DATA in the first to m-th page buffers PB1 to PBm.

During an erase operation, the read and write circuit 123 may allow the bit lines BL to float. In an embodiment, the read and write circuit 123 may include a column select circuit.

The data input/output circuit 124 is coupled to the first to m-th page buffers PB1 to PBm through the data lines DL. The data input/output circuit 124 is operated in response to the control of the control logic 130.

The data input/output circuit 124 may include a plurality of input/output buffers (not illustrated) which receive input data DATA. During a program operation, the data input/output circuit 124 receives the data DATA to be stored from an external controller (not illustrated). During a read operation, the data input/output circuit 124 outputs the data DATA, received from the first to m-th page buffers PB1 to PBm included in the read and write circuit 123, to the external controller.

During a read operation or a verify operation, the sensing circuit 125 may generate a reference current in response to an enable bit signal VRYBIT generated by the control logic 130, and may output a pass signal or a fail signal to the control logic 130 by comparing a sensing voltage VPB received from the read and write circuit 123 with a reference voltage generated by the reference current.

The control logic 130 may be coupled to the address decoder 121, the voltage generator 122, the read and write circuit 123, the data input/output circuit 124, and the sensing circuit 125. The control logic 130 may control the overall operation of the memory device 100. The control logic 130 may be operated in response to a command CMD transmitted from an external device.

The control circuit 130 may control the peripheral circuit 120 by generating various types of signals in response to the command CMD and the addresses ADDR. For example, the control logic 130 may generate an operation signal OPSIG, an address ADDR, read and write circuit control signals PBSIGNALS, and an enable bit VRYBIT in response to the command CMD and the addresses ADDR. The control logic 130 may output the operation signal OPSIG to the voltage generator 122, output the address ADDR to the address decoder 121, output the read and write circuit control signals PBSIGNALS to the read and write circuit 123, and output the enable bit VRYBIT to the sensing circuit 125. In addition, the control logic 130 may determine whether a verify operation has passed or failed in response to the pass or fail signal PASS or FAIL output from the sensing circuit 125.

In an embodiment, the control logic 130 may control the peripheral circuit 120 so that a program operation is performed on the selected memory cells of the memory cell array 110 in response to a program command. The program operation may include one or more program loops. Each program loop may include a program pulse apply operation and a program verify operation. This will be described later with reference to FIG. 4.

The control logic 130 may control the peripheral circuit 120 so that a program loop in execution is suspended in response to a received suspend command.

For example, the control logic 130 may receive the suspend command while the program pulse apply operation of the program loop is being performed. The control logic 130 may control the peripheral circuit 120 so that the program pulse apply operation of the program loop is completed in response to the suspend command. The control logic 130 may control the peripheral circuit 120 so that the program loop is suspended when the ongoing program pulse apply operation is completed. The suspension of the program loop occurring when the control logic 130 receives a suspend command during the program pulse apply operation will be described later with reference to FIG. 8.

The control logic 130 may receive the suspend command while the program verify operation of the program loop is being performed. The control logic 130 may control the peripheral circuit 120 so that the ongoing state verification operation, among respective state verification operations for one or more program states included in the program verify operation, is completed in response to the suspend command. The control logic 130 may control the peripheral circuit 120 so that the program loop is suspended when the ongoing state verification operation is completed. The suspension of the program loop occurring when the control logic 130 receives the suspend command during the program verify operation will be described later with reference to FIG. 10.

In an embodiment, the control logic 130 may control the peripheral circuit 120 so that a read operation is performed after the program loop has been suspended in response to the suspend command. Here, the suspend command may be a read command received during the execution of the program loop. Detailed descriptions thereof will be made later with reference to FIG. 5.

In an embodiment, the control logic 130 may control the peripheral circuit 120 so that a read operation is performed after the program loop has been suspended in response to the read command. Here, the read command may be a separate command received after the suspend command. Detailed descriptions thereof will be made later with reference to FIG. 6.

The control logic 130 may control the peripheral circuit 120 so that the suspended program loop is resumed in response to a received resume command.

For example, when the program loop is suspended after the program pulse apply operation has been completed and before the program verify operation starts, the control logic 130 may control the peripheral circuit 120 so that the program verify operation of the suspended program loop is resumed in response to the resume command. In various embodiments, the control logic 130 may control the peripheral circuit 120 so that, after the recovery pulse apply operation has been performed, the program verify operation is resumed in response to the resume command. The resumption of the program loop will be described later with reference to FIGS. 8 and 9.

The program verify operation may include state verification operations respectively corresponding to one or more program states. When the program loop is suspended after an ongoing state verification operation among the one or more state verification operations has been completed, the control logic 130 may control the peripheral circuit 120 so that one or more uncompleted state verification operations, which are subsequent to the completed state verification operation among the one or more state verification operations, are resumed in response to the resume command. In various embodiments, the control logic 130 may control the peripheral circuit 120 so that, after the recovery pulse apply operation has been performed, the uncompleted state verification operations are resumed in response to the resume command. The resumption of the program loop will be described later with reference to FIGS. 10 and 11.

Charges trapped in the channel area of the memory cells selected for the program operation may be detrapped while the program loop is suspended. The recovery pulse apply operation may be an operation of compensating for the charges detrapped from the channel area of the selected memory cells. The recovery pulse apply operation may be an operation of applying at least one recovery pulse to a selected word line coupled to selected memory cells.

The level of the recovery pulse may be variously set. In an embodiment, the level of the recovery pulse may be lower than that of a program pulse. The level of the recovery pulse may be equal to or higher than that of a pass voltage applied to an unselected word line. The level of the recovery pulse may be higher as a count value of the suspended program loop is larger.

Figure 3:
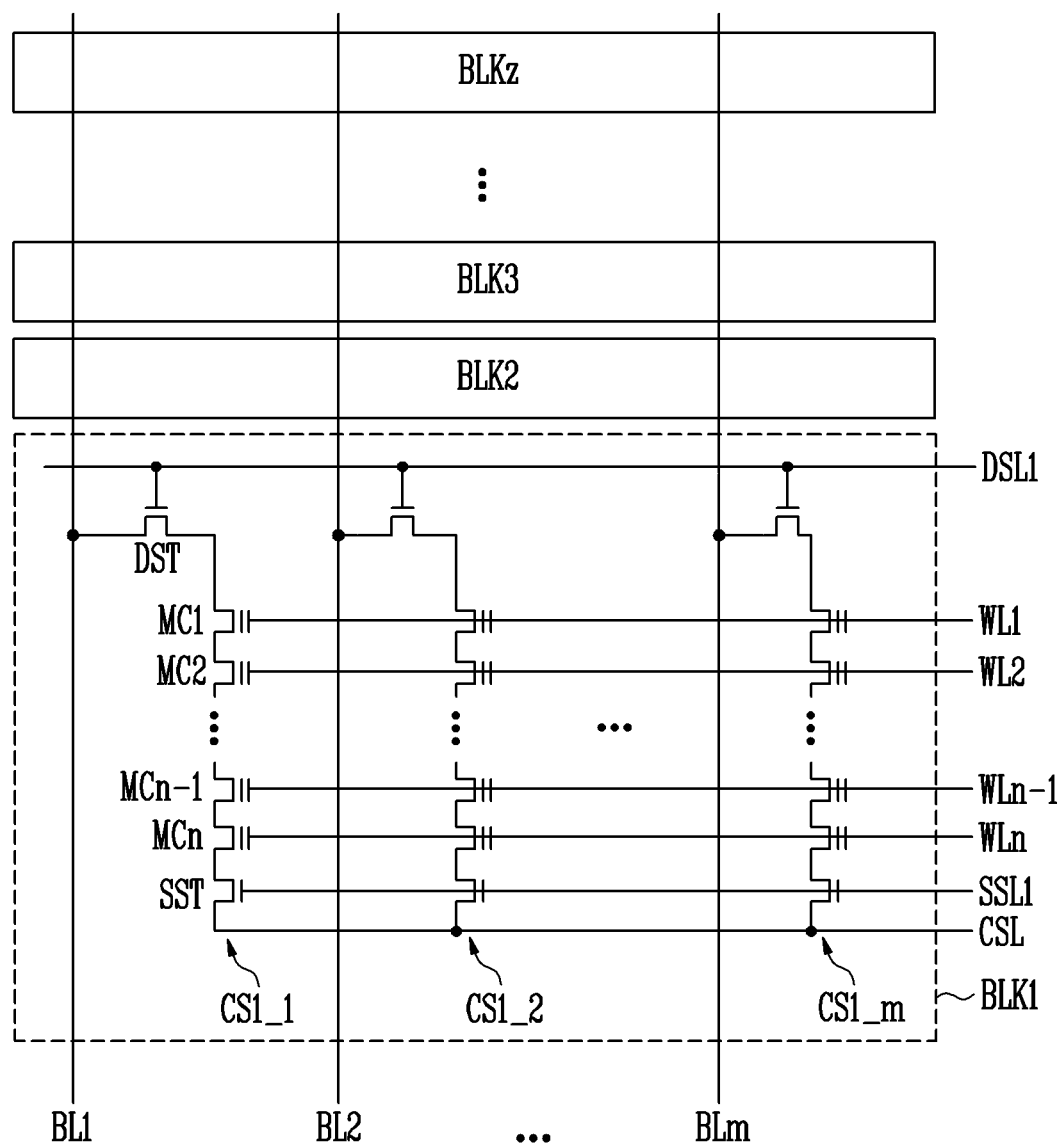
FIG. 3 is a diagram illustrating a memory cell array of FIG. 2.

FIG. 3 is a diagram illustrating the memory cell array of FIG. 2.

Referring to FIG. 3, the first to z-th memory blocks BLK1 to BLKz are coupled in common to the first to m-th bit lines BL1 to BLm. In FIG. 3, for convenience of description, elements included in the first memory block BLK1, among the plurality of memory blocks BLK1 to BLKz, are illustrated, and illustration of elements included in each of the remaining memory blocks BLK2 to BLKz is omitted. It will be understood that each of the remaining memory blocks BLK2 to BLKz has the same configuration as the first memory block BLK1.

The memory block BLK1 may include a plurality of cell strings CS1_1 to CS1_$m$, where m is a positive integer. The first to m-th cell strings CS1_1 to CS1_$m$ are respectively coupled to the first to m-th bit lines BL1 to BLm. Each of the first to m-th cell strings CS1_1 to CS1_$m$ may include a drain select transistor DST, a plurality of memory cells MC1 to MCn, where n is a positive integer, which are coupled in series to each other, and a source select transistor SST.

A gate terminal of the drain select transistor DST included in each of the first to m-th cell strings CS1_1 to CS1_$m$ is coupled to a drain select line DSL1. Gate terminals of the first to n-th memory cells MC1 to MCn included in each of the first to m-th cell strings CS1_1 to CS1_$m$ are coupled to first to n-th word lines WL1 to WLn, respectively. A gate terminal of the source select transistor SST included in each of the first to m-th cell strings CS1_1 to CS1_$m$ is coupled to a source select line SSL1.

For convenience of description, the structure of each cell string will be described based on the first cell string CS1_1, among the plurality of cell strings CS1_1 to CS1_$m$. However, it will be understood that each of the remaining cell strings CS1_2 to CS1_$m$ is configured in the same manner as the first cell string CS1_1.

A drain terminal of the drain select transistor DST included in the first cell string CS1_1 is coupled to the first bit line BL1. A source terminal of the drain select transistor DST included in the first cell string CS1_1 is coupled to a drain terminal of the first memory cell MC1 included in the first cell string CS1_1. The first to n-th memory cells MC1 to MCn may be coupled in series to each other. A drain terminal of the source select transistor SST included in the first cell string CS1_1 is coupled to a source terminal of the n-th memory cell MCn included in the first cell string CS1_1. A source terminal of the source select transistor SST included in the first cell string CS1_1 is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are included in the row lines RL of FIG. 2. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read and write circuit 123.

Figure 4:
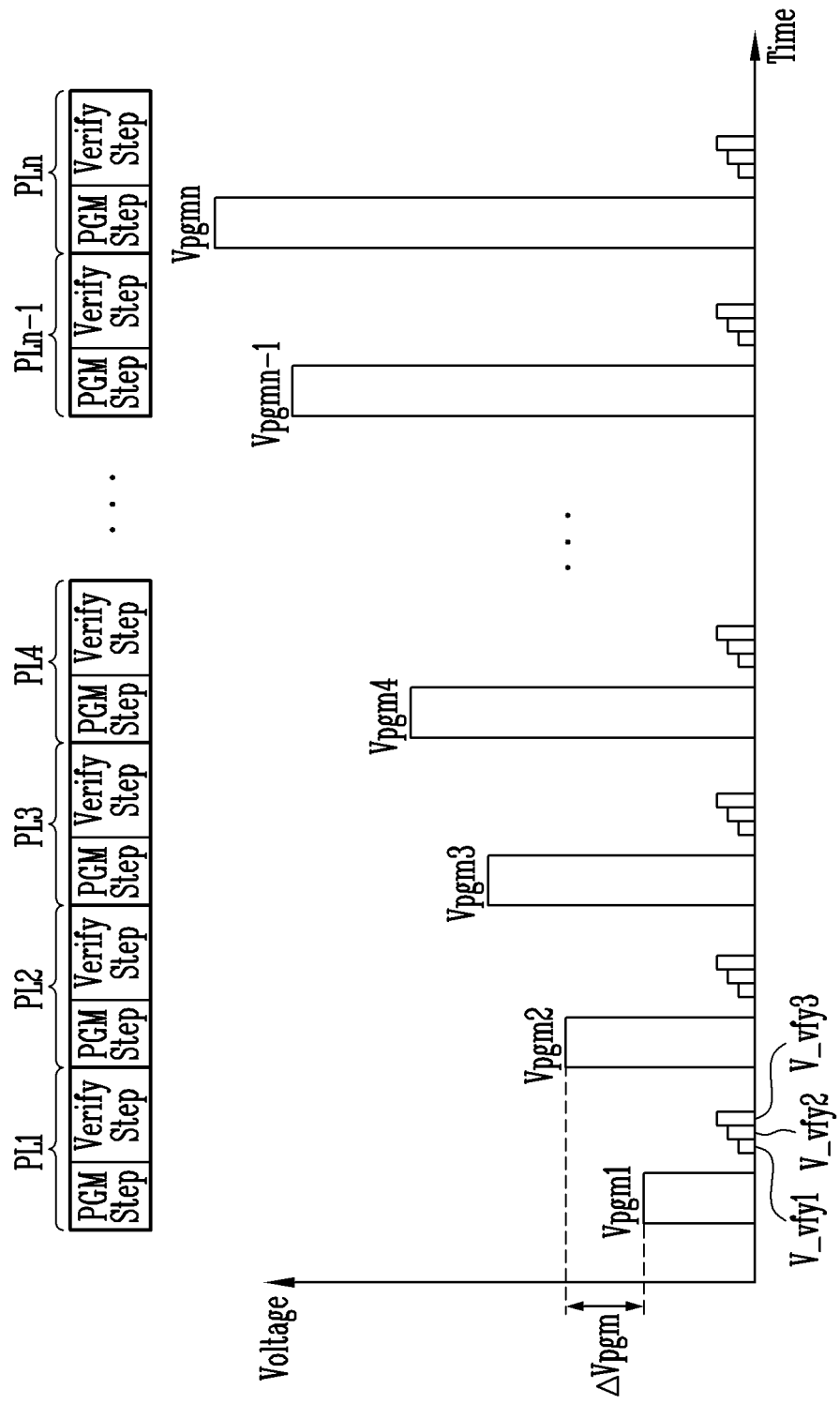
FIG. 4 is a diagram illustrating a program loop.

FIG. 4 is a diagram illustrating a program loop.

Referring to FIG. 4, a program operation may include a plurality of program loops PL1 to PLn, where n is a natural number of 1 or more. The memory device may perform a program operation so that each of selected memory cells has a target state, among a plurality of program states, by executing the plurality of program loops.

Each of the plurality of program loops may include a program voltage apply step (PGM Step) and a verify step (Verify Step).

At the program voltage apply step, a program voltage apply operation of applying a program voltage to a selected word line coupled to the selected memory cells may be performed. By the program pulse apply operation, each of the selected memory cells may be programmed to the target state, among the plurality of states. The target state may be determined depending on the data to be programmed to the selected memory cells.

At the verify step, a program verify operation of determining whether the selected memory cells have been programmed by applying verify voltages to the selected word line may be performed. The program verify operation may include state verification operations respectively corresponding to one or more target program states. The state verification operation may be an operation of determining whether the selected memory cells have been programmed to target program states by applying verify voltages corresponding to the target program states to the selected word line.

In an embodiment, the program voltage may be determined based on an incremental step pulse programming (ISPP) method. That is, the level of the program voltage may be increased or decreased by a set voltage increment (i.e., a step voltage) in a step-by-step manner while the program loops are repeated. The number of applications of program voltages used in respective program loops, the voltage levels of the program voltages, voltage application times, etc. may be determined in various forms under the control of the memory controller.

A pass voltage may be applied to the remaining word lines, that is, unselected word lines, other than the selected word line. In an embodiment, pass voltages having the same level may be applied to the unselected word lines. In an embodiment, the pass voltage may have different levels depending on the locations of word lines.

A ground voltage may be applied as a program permission voltage to the selected bit lines coupled to the memory cells to be programmed. A program inhibition voltage may be applied to the unselected bit lines, which are bit lines coupled to memory cells other than the memory cells to be programmed.

The memory device may apply the verify voltages to the selected word line and apply a verify pass voltage to the unselected word lines at the program verify step. The memory device may sense voltages or currents output through the bit lines to which the memory cells coupled to the selected word line are respectively coupled, and may determine whether the verify step has passed or failed based on the results of sensing.

At the program voltage apply step, each of the selected memory cells may be programmed to any one of first to m-th states, where m is a natural number of 1 or more.

At the verify step, a state verification operation for a program state corresponding to at least one of first to m-th states may be performed. For example, when memory cells to be programmed to a k-th state, where k is a natural number that is equal to or greater than 1 and is less than or equal to m, are read as off-cells through a verify voltage corresponding to the k-th state, a state verification operation for the k-th state may pass.

In FIG. 4, when the selected memory cells are multi-level cells (MLC), each storing two data bits, the selected memory cells may be programmed to any one of an erased state and first to third program states. The number of data bits stored in one memory cell is not limited to the present embodiment.

When the first program loop PL1 is executed, a first program voltage Vpgm1 is applied, and thereafter the first to third verify voltages V_vfy1 to V_vfy3 are sequentially applied to verify the program states of the plurality of memory cells. For example, memory cells, the target states of which are the first program state, may be verified using the first verify voltage V_vfy1, memory cells, the target states of which are the second program state, may be verified using the second verify voltage V_vfy2, and memory cells, the target states of which are the third program state, may be verified using the third verify voltage V_vfy3. The number of verify voltages is not limited to the present embodiment.

The memory cells which have passed verification through respective verify voltages V_vfy1 to V_vfy3 may be determined to have the target states, and may then be program-inhibited in the second program loop PL2. A program inhibition voltage may be applied to the bit lines coupled to the program-inhibited memory cells. In the second program loop PL2, a second program voltage Vpgm2 higher than the first program voltage Vpgm1 by a unit voltage ΔVpgm is applied to the selected word line.

Thereafter, a program verify operation is performed in the same way as the program verify operation in the first program loop PL1. In an example, the term "verification pass" indicates that each memory cell is read as an off-cell through the corresponding verify voltage.

As described above, when the memory device programs multi-level cells (MLC), the memory device verifies the memory cells having respective program states as target states using the first to third verify voltages V_vfy1 to V_vfy3.

In various embodiments, when the program operation is not completed within a set number of program loops, the program operation may fail. When the program operation is completed within a set number of program loops, the program operation may pass. Whether the program operation is completed may be determined depending on whether the selected memory cells have passed all program verify operations. When the selected memory cells have passed all program verify operations, a next program loop may not be executed.

Figure 5:
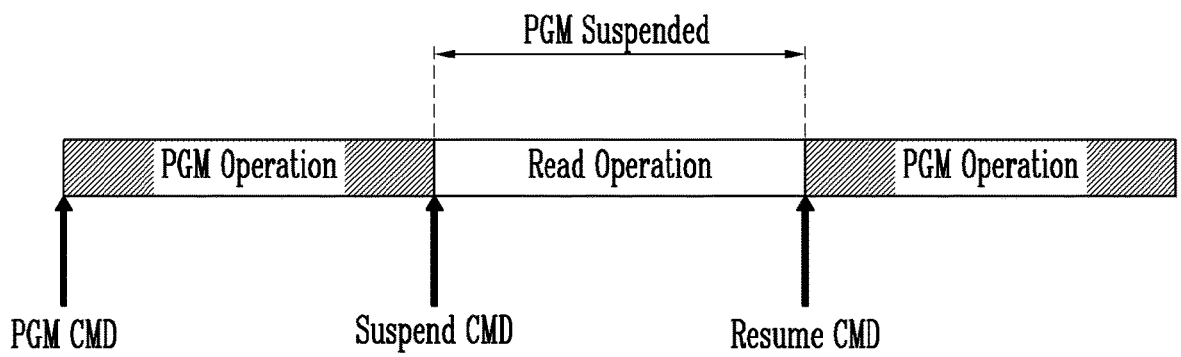
FIG. 5 is a diagram for describing a suspend command according to an embodiment of the present disclosure.

FIG. 5 is a diagram for describing a suspend command according to an embodiment.

Referring to FIG. 5, the memory device 100 of FIG. 1 may perform a program operation in response to an input program command PGM CMD. The memory device 100 may suspend the program operation when a read command is input while the program operation is being performed. The read command that is input during the program operation may function as a suspend command Suspend CMD for suspending the program operation.

In an embodiment, the memory device 100 may perform a read operation after the program operation has been suspended in response to the suspend command. When a resume command Resume CMD is input after the read operation has been completed, the memory device 100 may resume the suspended program operation.

Figure 6:
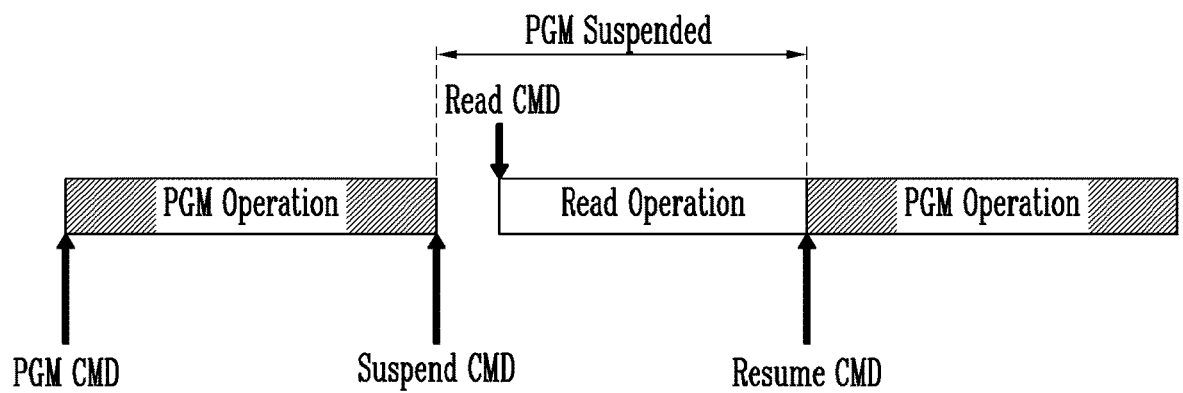
FIG. 6 is a diagram for describing a suspend command according to an embodiment of the present disclosure.

FIG. 6 is a diagram for describing a suspend command according to an embodiment.

Referring to FIG. 6, the memory device 100 of FIG. 1 may perform a program operation in response to an input program command PGM CMD. The memory device 100 may suspend the program operation when a suspend command is input while the program operation is being performed.

The memory device 100 may perform a read operation in response to a read command that is input after the program operation has been suspended. When a resume command Resume CMD is input after the read operation has been completed, the memory device 100 may resume the suspended program operation.

The suspend command in FIG. 5 may be the read command that is input during the program operation. The suspend command in FIG. 6 may be a command for suspending a program operation, and may be a separate command distinguished from a read command.

Figure 7:
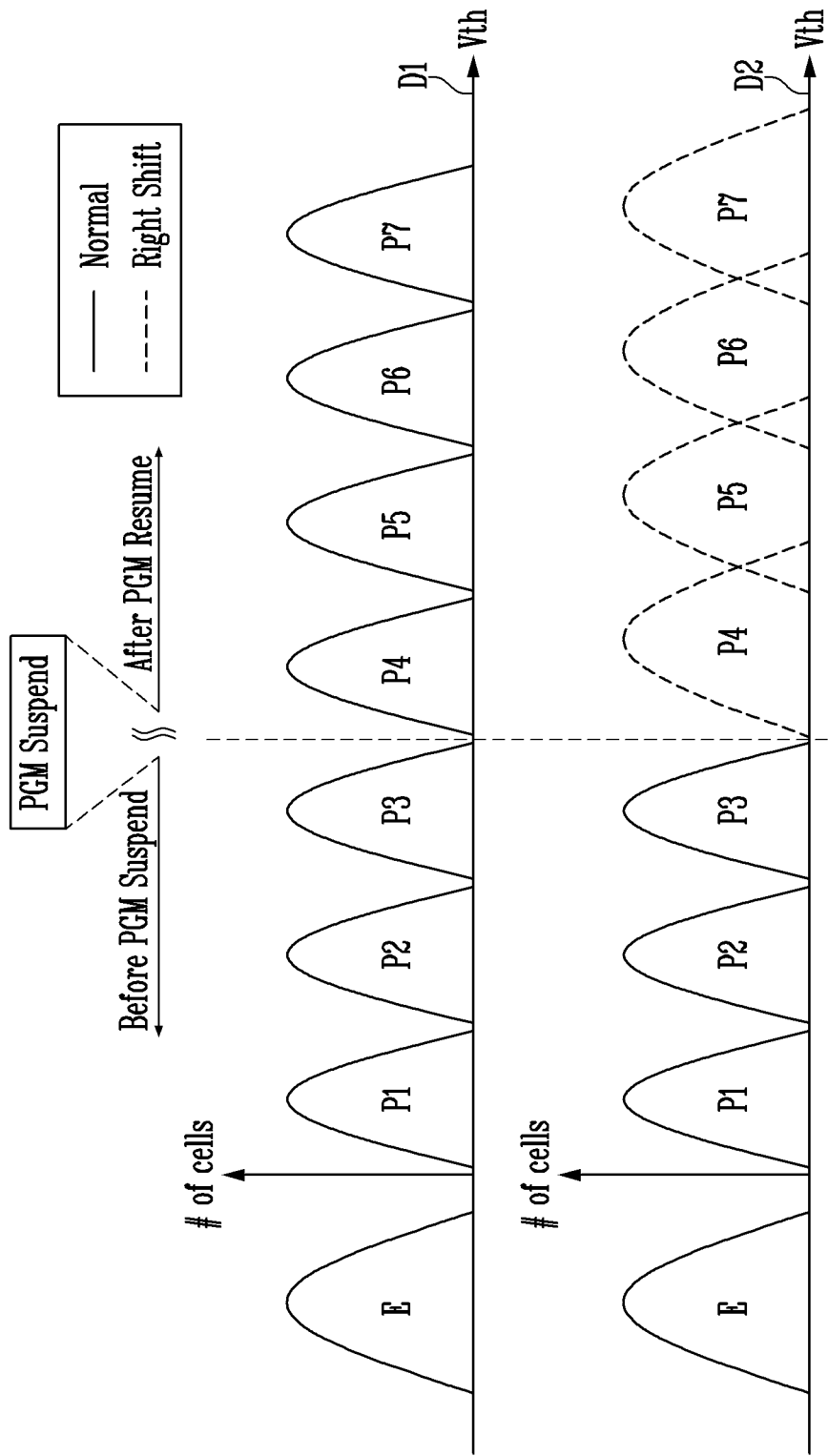
FIG. 7 is a diagram illustrating the degradation of a threshold voltage distribution occurring when charges in a channel area of memory cells selected for a program operation are detrapped during the suspension of the program operation.

FIG. 7 is a diagram illustrating the degradation of a threshold voltage distribution occurring when charges in a channel area of memory cells selected for a program operation are detrapped during the suspension of the program operation.

In FIG. 7, the selected memory cells are triple-level cells. However, the number of data bits stored in each selected memory cell is not limited to the present embodiment.

Each of the selected memory cells may be programmed to any one of a plurality of states E and P1 to P7. A program loop may be sequentially executed in a direction in which a threshold voltage distribution increases from an erased state E to a seventh program state P7.

In FIG. 7, the program loop is suspended after a program operation for the third program state P3 has been completed. A time point at which the program loop is suspended is not limited to the present embodiment.

Thereafter, when the suspended program loop is resumed, the program loop may sequentially progress in a direction in which the threshold voltage distribution increases from the fourth program state P4 to the seventh program state P7.

During the suspension of the program loop (PGM Suspend), the degradation of the threshold voltage distribution may be caused when charges trapped in the channel area of the selected memory cells are discharged. When the charges trapped in the channel area of the selected memory cells are discharged, the magnitude of a sensing current may increase during a program verify operation. When the magnitude of the sensing current increases, the level of a verify voltage becomes higher than a reference level, and thus the selected memory cells may be programmed in a state in which the threshold voltage distribution of the selected memory cells are shifted to right with respect to a normal threshold voltage distribution.

For example, a first threshold voltage distribution D1 may be the threshold voltage distribution of selected memory cells that are programmed when the charges trapped in the channel area of the selected memory cells are not detrapped while the program loop is suspended.

A second threshold voltage distribution D2 may be the threshold voltage distribution of selected memory cells that are programmed when the charges trapped in the channel area of the selected memory cells are detrapped while the program loop is suspended.

Figure 8:
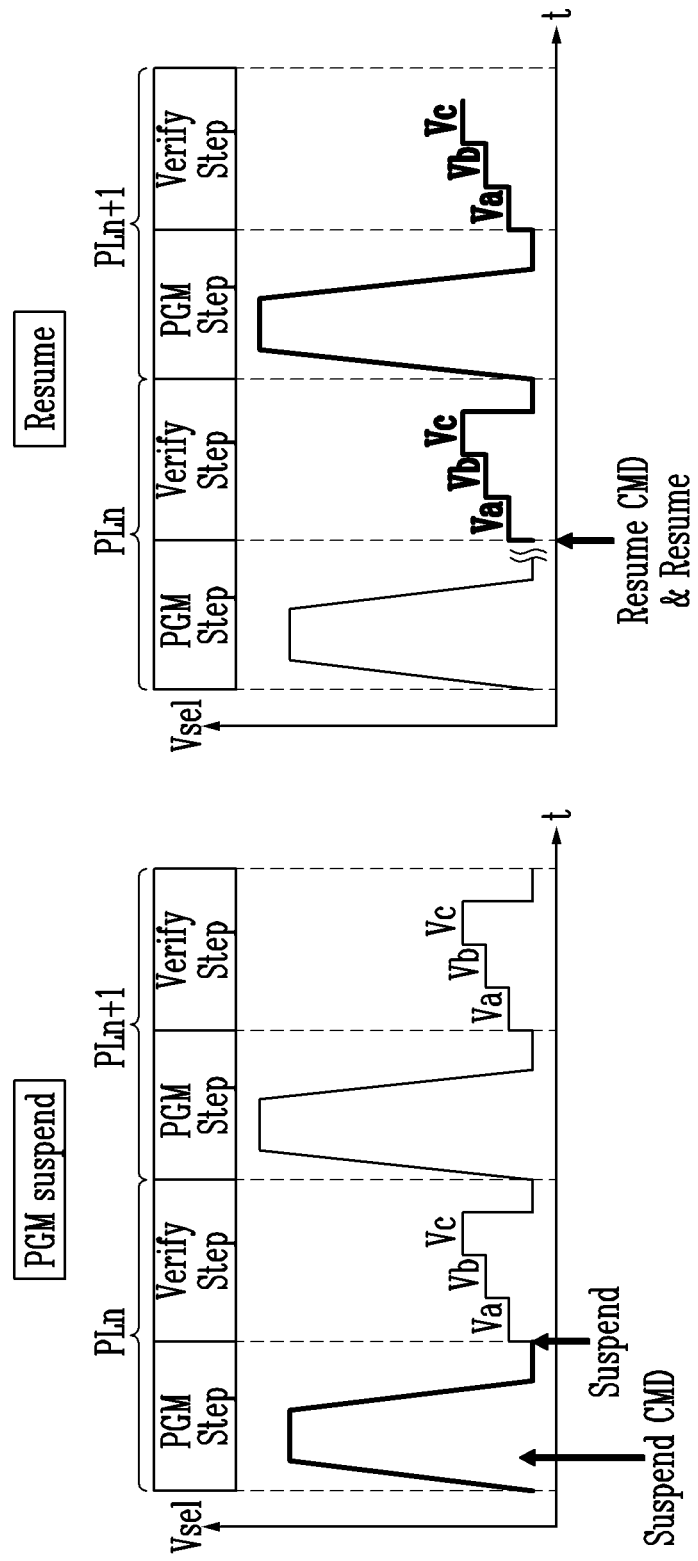
FIG. 8 is a diagram illustrating suspension and resumption of a program loop when a suspend command is received during a program pulse apply operation according to an embodiment of the present disclosure.

FIG. 8 is a diagram illustrating suspension and resumption of a program loop when a suspend command is received during a program pulse apply operation according to an embodiment.

Referring to FIG. 8, each program loop PL may include a program voltage apply step (PGM Step) at which a program pulse apply operation is performed and a verify step (Verify Step) at which a program verify operation is performed.

During a program pulse apply operation of an n-th program loop PLn, a suspend command may be input. In this case, after the program pulse apply operation has been completed, the n-th program loop PLn may be suspended. A time point at which the program loop is suspended is not limited to the present embodiment.

Thereafter, when a resume command is input, the program verify operation of the n-th program loop PLn may be first resumed. The program verify operation may include state verification operations respectively corresponding to one or more program states.

In FIG. 8, the program verify operation may include first to third state verification operations. For example, the first state verification operation may be an operation of verifying, using a first verify voltage Va, whether selected memory cells have been programmed to a first program state. The second state verification operation may be an operation of verifying, using a second verify voltage Vb, whether selected memory cells have been programmed to a second program state. The third state verification operation may be an operation of verifying, using a third verify voltage Vc, whether selected memory cells have been programmed to a third program state.

The number of state verification operations included in the program verify operation is not limited to the present embodiment. In other words, the number of program states to be verified in the program verify operation is not limited to the present embodiment. The number of verify voltages and the levels of the verify voltages may vary with the count of the program loop.

When the program verify operation of the n-th program loop PLn is completed, an n+1-th program loop PLn+1 may be performed. During a program pulse apply operation of the n+1-th program loop PLn+1, a program voltage higher than that of the n-th program loop PLn may be applied using an incremental step pulse program (ISPP) method.

Figure 9:
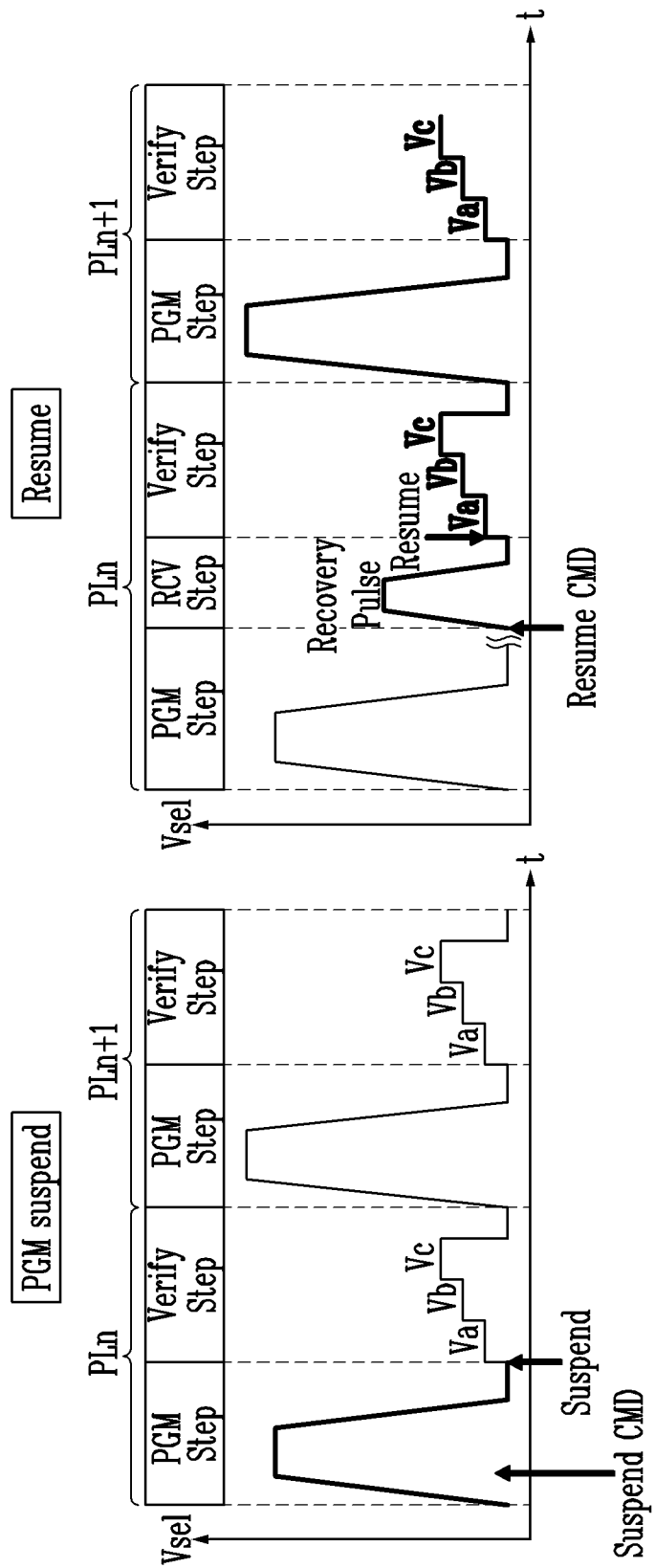
FIG. 9 is a diagram illustrating a recovery pulse apply operation that is performed during the resumption of the program loop of FIG. 8.

FIG. 9 is a diagram illustrating a recovery pulse apply operation that is performed during the resumption of the program loop of FIG. 8.

Referring to FIG. 9, the suspension of the program loop may be described similarly to FIG. 8.

During the program pulse apply operation of the n-th program loop PLn, a suspend command may be input. In this case, after the program pulse apply operation has been completed, the n-th program loop PLn may be suspended.

Thereafter, when a resume command is input, a recovery pulse apply operation may be performed, after which the program verify operation of the n-th program loop PLn may be resumed. The program verify operation may be described similarly to FIG. 8.

The recovery pulse apply operation may be an operation of compensating for charges detrapped from a channel area of selected memory cells during an interval from the suspension of the n-th program loop Pn to the reception of the resume command. By compensating for detrapped charges through the recovery pulse apply operation, a threshold voltage distribution of selected memory cells may be prevented from being degraded during a program operation in a next program loop. For example, when the charges in the channel area are detrapped, the amount of sensing current is measured as a value greater than that measured before a time point at which the program loop is suspended, and a verify voltage may become higher than a reference level. When the verify voltage becomes higher than the reference level, degradation in which the threshold voltage distribution is shifted to the right may occur. Therefore, the degradation of the threshold voltage distribution may be prevented by compensating for the detrapped charges.

The recovery pulse apply operation may be an operation of applying at least one recovery pulse to a selected word line coupled to selected memory cells. The level of the recovery pulse may be lower than that of a program pulse applied during the program pulse apply operation of the program loop. The level of the recovery pulse may be equal to or higher than that of a pass voltage applied during the program pulse apply operation.

In various embodiments, the recovery pulse apply operation may be an operation of applying at least one recovery pulse to bit lines coupled to memory strings including selected memory cells. Here, the level of the recovery pulse may be lower than a ground voltage.

Figure 10:
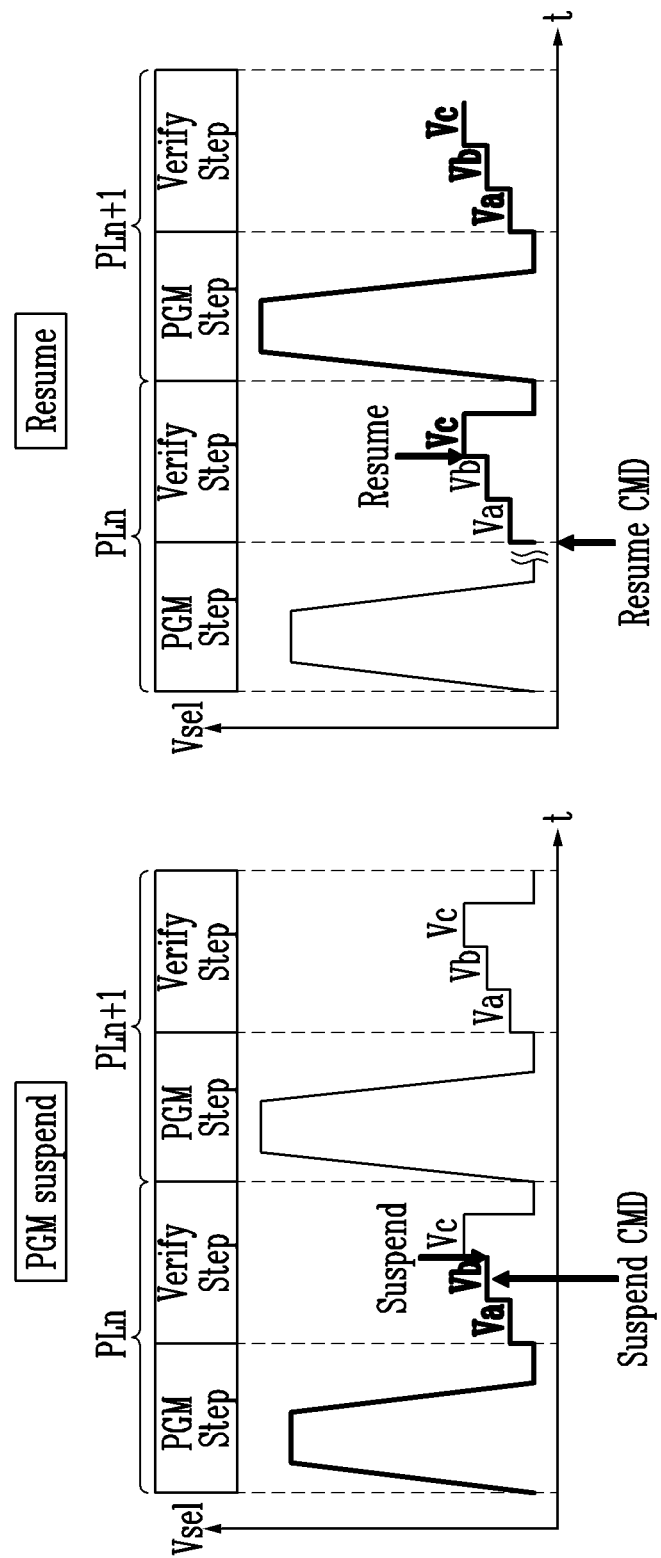
FIG. 10 is a diagram illustrating suspension and resumption of a program loop when a suspend command is received during a program verify operation according to an embodiment of the present disclosure.

FIG. 10 is a diagram illustrating suspension and resumption of a program loop when a suspend command is received during a program verify operation according to an embodiment.

The program verify operation may include state verification operations respectively corresponding to one or more program states. Each state verification operation may be an operation of determining whether the selected memory cells have been programmed to a target program state by applying a verify voltage corresponding to the corresponding target program state to the selected word line.

When a suspend command is received while a state verification operation is being performed among state verification operations to be performed within in the program loop, the program loop may be suspended after the completion of the ongoing state verification operation. When a resume command is received, an uncompleted state verification operation, which is immediately subsequent to the completed state verification operation among the one or more state verification operations, may be first resumed.

In FIG. 10, the program verify operation of an n-th program loop PLn may include first to third state verification operations. For example, the first to third state verification operations may be the operations of verifying, using first to third verify voltages Va to Vc, whether the selected memory cells have been programmed to first to third program states. The number of state verification operations included in the program verify operation is not limited to the present embodiment. In other words, the number of program states desired to be verified in the program verify operation is not limited to the present embodiment.

For example, during the program verify operation of the n-th program loop PLn, a suspend command may be input. For example, the suspend command may be input during the second state verification operation included in the program verify operation of the n-th program loop PLn. In this case, after the second state verification operation has been completed, the n-th program loop PLn may be suspended. In this case, the results of the first and second state verification operations may be separately stored.

Thereafter, when a resume command is input, the third state verification operation included in the program verify operation of the n-th program loop PLn may be first resumed. For example, after the n-th program loop PLn has been resumed, only the result of the third state verification operation may be stored because the results of the first and second state verification operations have already been stored.

When the program verify operation of the n-th program loop PLn is completed, an n+1-th program loop PLn+1 may be executed. During a program pulse apply operation of the n+1-th program loop PLn+1, a program voltage higher than that of the n-th program loop PLn may be applied using an incremental step pulse program (ISPP) method.

Figure 11:
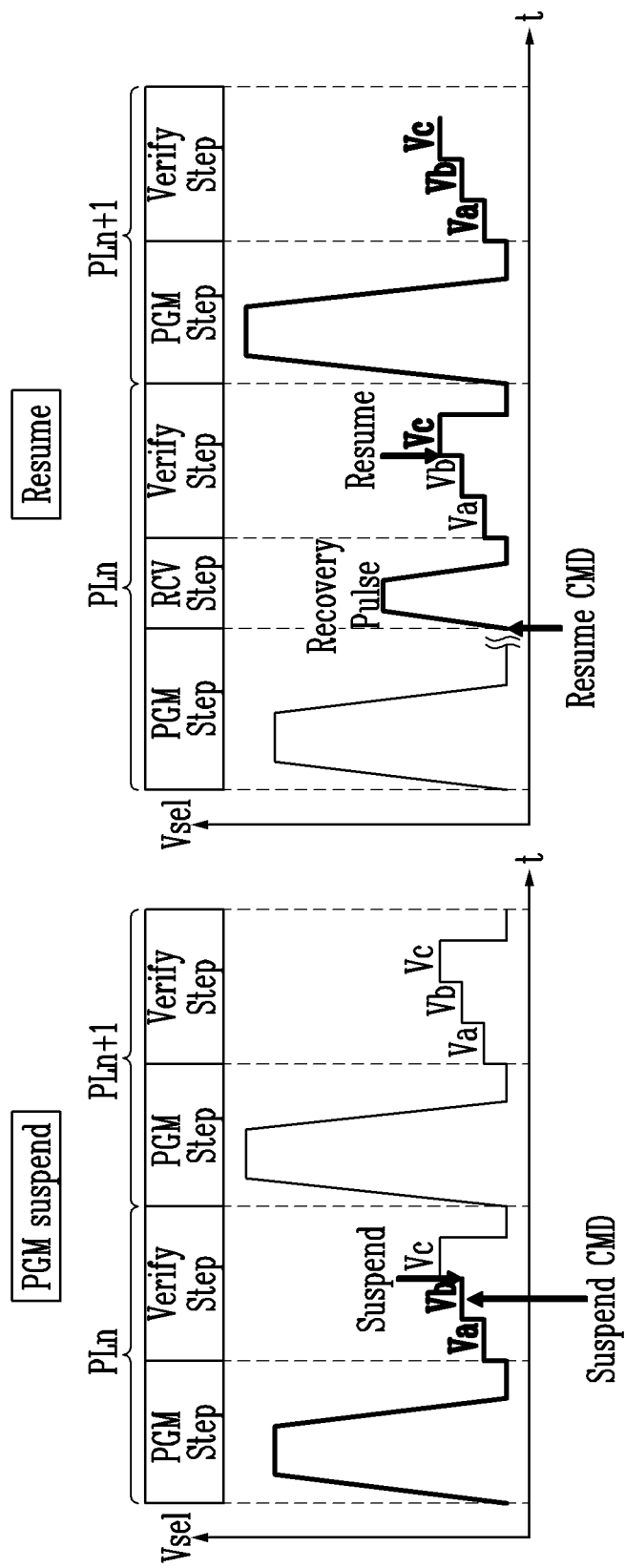
FIG. 11 is a diagram illustrating a recovery pulse apply operation performed during the resumption of the program loop of FIG. 10.

FIG. 11 is a diagram illustrating a recovery pulse apply operation performed during the resumption of the program loop of FIG. 10.

Referring to FIG. 11, the suspension of the program loop may be described similarly to FIG. 10.

A suspend command may be input during the second state verification operation included in the program verify operation of the n-th program loop PLn. In this case, after the second state verification operation has been completed, the n-th program loop PLn may be suspended.

Thereafter, when a resume command is input, the recovery pulse apply operation may be performed, after which the third state verification operation included in the program verify operation of the n-th program loop PLn may be resumed. The program verify operation may be described similarly to FIG. 10.

The recovery pulse apply operation may be an operation of compensating for charges detrapped from a channel area of selected memory cells during an interval from the suspension of the n-th program loop Pn to the reception of the resume command, as described above with reference to FIG. 9.

Figure 12:
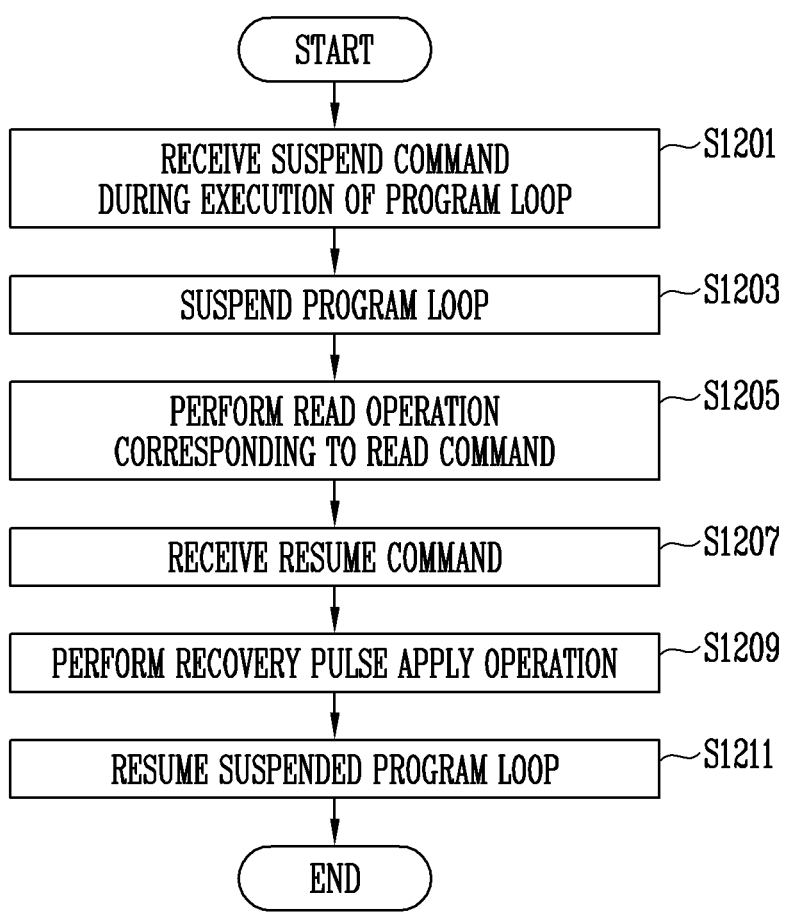
FIG. 12 is a flowchart illustrating the operation of a memory device according to an embodiment of the disclosure.

FIG. 12 is a flowchart illustrating the operation of a memory device according to an embodiment.

Referring to FIG. 12, at operation S1201, the memory device may receive a suspend command during the execution of a program loop.

At operation S1203, the memory device may suspend the program loop.

At operation S1205, the memory device may perform a read operation corresponding to a read command. In an embodiment, the read command may be a separate command received after the suspend command. In an embodiment, the read command may be a suspend command received during the execution of the program loop.

At operation S1207, the memory device may receive a resume command.

At operation S1209, the memory device may perform a recovery pulse apply operation. The recovery pulse apply operation may be an operation of compensating for charges detrapped from a channel area of selected memory cells during an interval from the suspension of the program loop at operation S1203 to the reception of the resume command at operation S1207.

At operation S1211, the memory device may resume the suspended program loop.

In accordance with an embodiment of the present disclosure, when the suspend command is received during the execution of the program loop, the program loop is not suspended after the corresponding program loop has been entirely completed, and thus it is possible to easily secure a read latency during the read operation performed at operation S1205.

In accordance with an embodiment of the present disclosure, when a resume command is received, the corresponding program loop is immediately resumed from the point at which the program loop was suspended without repeating the same program loop, thus reducing required time costs.

In accordance with an embodiment of the present disclosure, a recovery pulse apply operation is performed after a resume command has been received, and thus degradation of a threshold voltage distribution caused by latency from the suspension to resumption of the program loop may be prevented.

Figure 13:
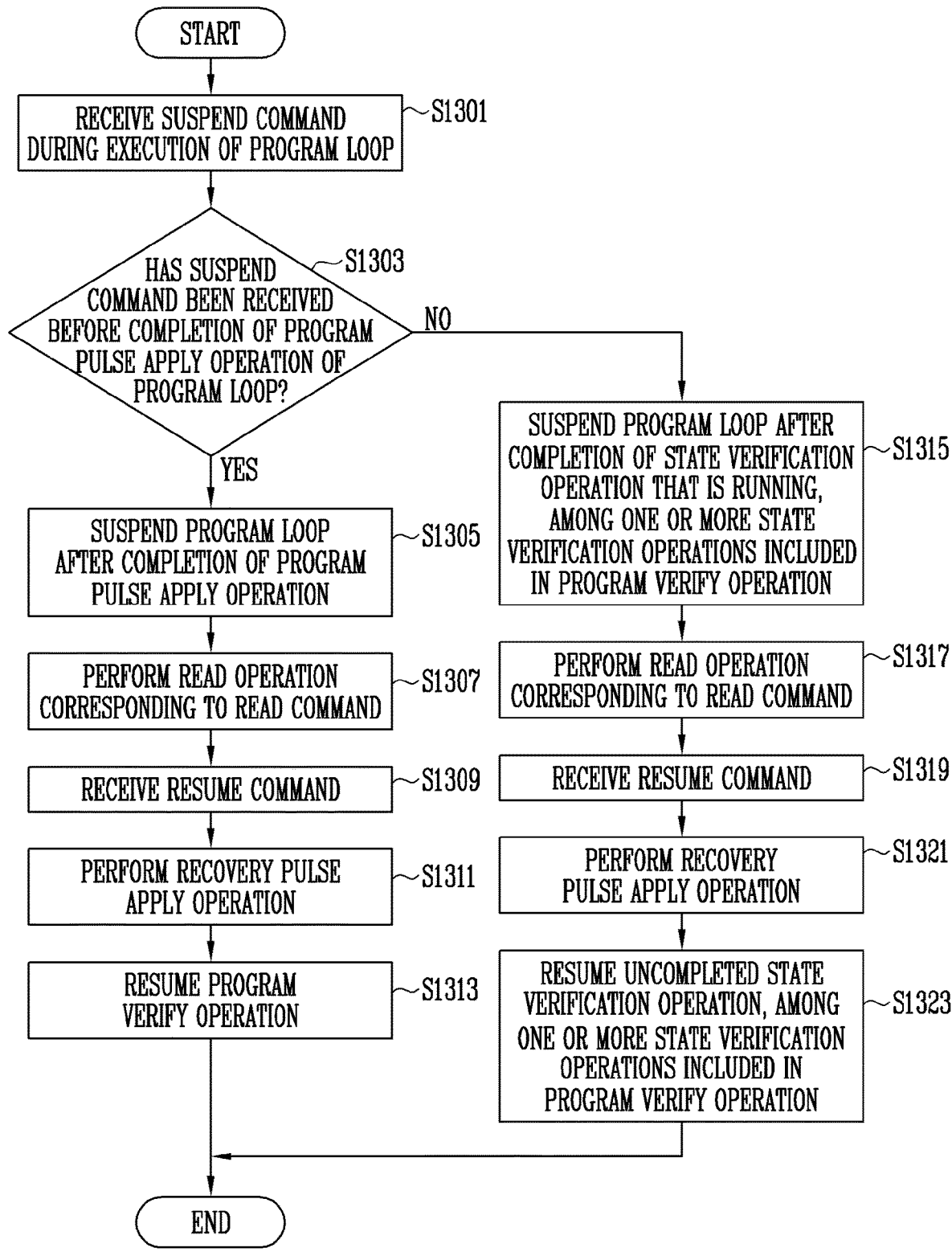
FIG. 13 is a flowchart illustrating in detail the operation of the memory device of FIG. 12.

FIG. 13 is a flowchart illustrating in detail the operation of the memory device of FIG. 12.

Referring to FIG. 13, at operation S1301, the memory device may receive a suspend command during the execution of a program loop.

At operation S1303, the memory device may determine whether the suspend command has been received before a program pulse apply operation of the program loop is completed. When it is determined that the suspend command has been received before the completion of the program pulse apply operation (in case of Yes), the process proceeds to operation S1305. When it is determined that the suspend command has been received after the completion of the program pulse apply operation (in case of No), that is, when the suspend command has been received during a program verify operation of the program loop, the process proceeds to operation S1315.

At operation S1305, the memory device may suspend the program loop after the completion of the program pulse apply operation that is being performed.

At operation S1307, the memory device may perform a read operation corresponding to a read command. In an embodiment, the read command may be a separate command received after the suspend command. In an embodiment, the read command may be the suspend command received at operation S1301.

At operation S1309, the memory device may receive a resume command.

At operation S1311, the memory device may perform a recovery pulse apply operation. The recovery pulse apply operation may be an operation of compensating for charges detrapped from a channel area of selected memory cells.

At operation S1313, the memory device may resume the suspended program loop. For example, the memory device may resume a program verify operation of the suspended program loop.

At operation S1315, the memory device may suspend the program loop after completing a state verification operation that is running, among one or more state verification operations included in the program verify operation. Each state verification operation may be an operation of determining whether the selected memory cells have been programmed to a target program state by applying a verify voltage corresponding to the corresponding target program state to a selected word line.

At operation S1317, the memory device may perform a read operation corresponding to a read command. In an embodiment, the read command may be a separate command received after the suspend command. In an embodiment, the read command may be the suspend command received at operation S1301.

At operation S1319, the memory device may receive a resume command.

At operation S1321, the memory device may perform a recovery pulse apply operation. The recovery pulse apply operation may be an operation of compensating for charges detrapped from the channel area of the selected memory cells.

At operation S1323, the memory device may resume the suspended program loop. For example, the memory device may resume an uncompleted state verification operation, among the one or more state verification operations included in the program verify operation.

What is claimed is:

1. A memory device, comprising:
a plurality of memory cells;
a peripheral circuit configured to perform a plurality of program loops, each including a program pulse apply operation and a program verify operation, on selected memory cells among the plurality of memory cells; and
a control logic configured to control, in response to a suspend command, the peripheral circuit to suspend an n-th program loop among the plurality of program loops, where n is a natural number of 1 or more, and configured to control, in response to a resume command, the peripheral circuit to resume the suspended n-th program loop after performing a recovery pulse apply operation compensating for charges detrapped from a channel area of the selected memory cells, and
wherein the peripheral circuit resumes an uncompleted state verification operation, among respective state verification operations for one or more program states included in the program verify operation of the suspended n-th program loop in response to the resume command.

2. The memory device according to claim 1, wherein, when the suspend command is received during the program pulse apply operation of the n-th program loop, the control logic controls the peripheral circuit to suspend the n-th program loop after the program pulse apply operation has been completed.

3. The memory device according to claim 2, wherein the control logic controls the peripheral circuit to resume the program verify operation of the suspended n-th program loop in response to the resume command.

4. The memory device according to claim 1, wherein when the suspend command is received during the program verify operation of the n-th program loop, the control logic controls the peripheral circuit to suspend the n-th program loop after an ongoing state verification operation, among the respective state verification operations for the one or more program states included in the program verify operation of the n-th program loop, has been completed.

5. The memory device according to claim 1, wherein the control logic is further configured to control the peripheral circuit to perform a read operation on memory cells among the plurality of memory cells after the n-th program loop has been suspended.

6. The memory device according to claim 5, wherein the control logic controls the peripheral circuit to perform the read operation in response to the suspend command.

7. The memory device according to claim 5, wherein the control logic controls the peripheral circuit to perform the read operation in response to a read command received after the suspend command.

8. The memory device according to claim 1, wherein the recovery pulse apply operation is an operation of applying at least one recovery pulse to a selected word line coupled to the selected memory cells.

9. The memory device according to claim 8, wherein a level of the recovery pulse is lower than a level of a program pulse applied to the selected word line during the program pulse apply operation.

10. The memory device according to claim 8, wherein a level of the recovery pulse is equal to or higher than a level of a pass voltage applied to an unselected word line during the program pulse apply operation of the n-th program loop.

11. The memory device according to claim 8, wherein a level of the recovery pulse is constant, or increases as a count of the n-th program loop increases.

12. A method of operating a memory device including a plurality of memory cells, the method comprising:
    suspending an n-th program loop among a plurality of program loops on selected memory cells among the plurality of memory cells in response to a suspend command received during the n-th program loop, where n is a natural number of 1 or more; and
    resuming the suspended n-th program loop after a recovery pulse apply operation has been performed in response to a resume command,
    wherein each of the plurality of program loops includes a program pulse apply operation and a program verify operation,
    wherein the recovery pulse apply operation is an operation of compensating for charges detrapped from a channel area of the selected memory cells, and
    wherein the resuming of the suspended n-th program loop comprises resuming an uncompleted state verification operation, among respective state verification operations for one or more program states included in the program verify operation of the suspended n-th program loop.

13. The method according to claim 12, further comprising performing a read operation on memory cells among the plurality of memory cells in response to the suspend command or a read command after the n-th program loop is suspended.

14. The method according to claim 12, wherein the suspending of the n-th program loop comprises:
    receiving the suspend command during the program pulse apply operation of the n-th program loop; and
    suspending the n-th program loop after the program pulse apply operation has been completed.

15. The method according to claim 14, wherein the resuming of the suspended n-th program loop comprises resuming the program verify operation of the suspended n-th program loop.

16. The method according to claim 12, wherein the suspending of the n-th program loop comprises:
    receiving the suspend command during the program verify operation of the n-th program loop; and
    suspending the n-th program loop after completion of an ongoing state verification operation, among the respective state verification operations for the one or more program states that are included in the program verify operation of the n-th program loop.

17. The method according to claim 12, wherein the recovery pulse apply operation applies at least one recovery pulse to a selected word line coupled to the selected memory cells.

18. The method according to claim 17, wherein a level of the recovery pulse is lower than a level of a program pulse applied to the selected word line and is equal to or higher than a level of a pass voltage applied to an unselected word line, during the program pulse apply operation.

19. An operating method of a memory device, the operating method comprising:
    suspending, in response to a suspend command for a program operation on a storage unit, a start of a state verification operation on one among program states, the state verification operation being a part of the program operation;
    applying, in response to a resume command for the program operation, one or more recovery pulses to the storage unit; and
    resuming, upon completion of the applying, the program operation from an uncompleted point of the state verification operation.

* * * * *